US008230685B2

(12) United States Patent
Lin

(10) Patent No.: US 8,230,685 B2
(45) Date of Patent: Jul. 31, 2012

(54) PORTABLE SOLAR POWER GENERATOR

(75) Inventor: I-Thun Lin, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 594 days.

(21) Appl. No.: 12/468,845

(22) Filed: May 19, 2009

(65) Prior Publication Data
US 2010/0005800 A1    Jan. 14, 2010

(30) Foreign Application Priority Data

Jul. 8, 2008 (CN) .......................... 2008 1 0302631

(51) Int. Cl.
*B60K 16/00* (2006.01)
*B60L 8/00* (2006.01)
*F03G 6/00* (2006.01)
*H02N 6/00* (2006.01)
*H01L 31/042* (2006.01)

(52) U.S. Cl. ................ 60/641.8; 136/245; 136/251
(58) Field of Classification Search ............... 60/641.8, 60/641.15; 126/698–700, 704–713; 136/243–251; 307/43–82; 320/101

See application file for complete search history.

(56) References Cited

U.S. PATENT DOCUMENTS

| 5,296,044 A * | 3/1994 | Harvey et al. ................. 136/245 |
| 6,376,764 B1 * | 4/2002 | Luo .............................. 136/244 |
| 7,026,541 B2 * | 4/2006 | Heidrich ...................... 136/251 |

FOREIGN PATENT DOCUMENTS

| EP | 1885038 A1 | 2/2008 |
| JP | 09307125 A | * 11/1997 |
| JP | 10270729 A | * 10/1998 |

* cited by examiner

*Primary Examiner* — Thomas Denion
*Assistant Examiner* — Christopher Jetton
(74) *Attorney, Agent, or Firm* — Altis Law Group, Inc.

(57) ABSTRACT

A solar power generator includes a number of solar cell units, a shaft and a connector assembly. Each of the solar cell units has a housing defining a through hole at one end and an opening in an upper surface thereof. A number of solar panels are received in the opening. The shaft passes through each through hole thereby aligning the solar cell units in a manner that one stacked on another. Each of the solar cell units is capable of rotating around the shaft. The connector assembly is electrically coupled to the solar panel for providing electrical energy to a power consuming device.

7 Claims, 4 Drawing Sheets

PORTABLE SOLAR POWER GENERATOR

BACKGROUND

1. Technical Field

The present invention relates to solar cell technology, in particular, relates to a portable solar power generator.

2. Description of Related Art

Currently, portable electronic devices such as personal digital assistants (PDAs), mobile phones, MP3 players are very popular due to their portability and versatile functions. However, more functions also mean higher power consuming rates, and advance of batteries cannot meet increasing of energy supply requirements for these devices. Thus, portable electronic devices all suffer from short working time and batteries need to be frequently recharged. However, in most outdoor conditions, power supply and outlets may not be available to charge the batteries.

Therefore, there is a desire to provide a portable power generator for recharging batteries.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of embodiments. Moreover, in the drawings, like reference numerals designate corresponding parts throughout the different views.

DETAILED DESCRIPTION

Figure 1:
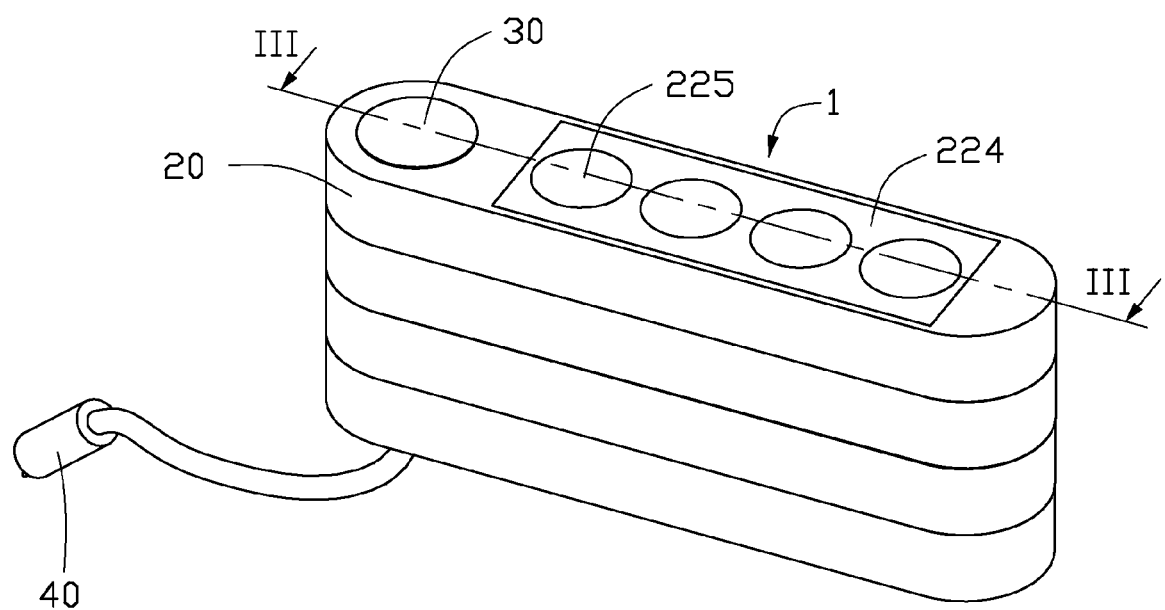
FIG. 1 is an isometric view illustrating a portable solar power generator including a number of solar cell units in accordance with an exemplary embodiment.

As illustrated in FIG. 1, a portable solar power generator 1 provided in a first exemplary embodiment includes a number of solar cells units 20, a shaft 30, and a connector assembly 40.

Figure 2:
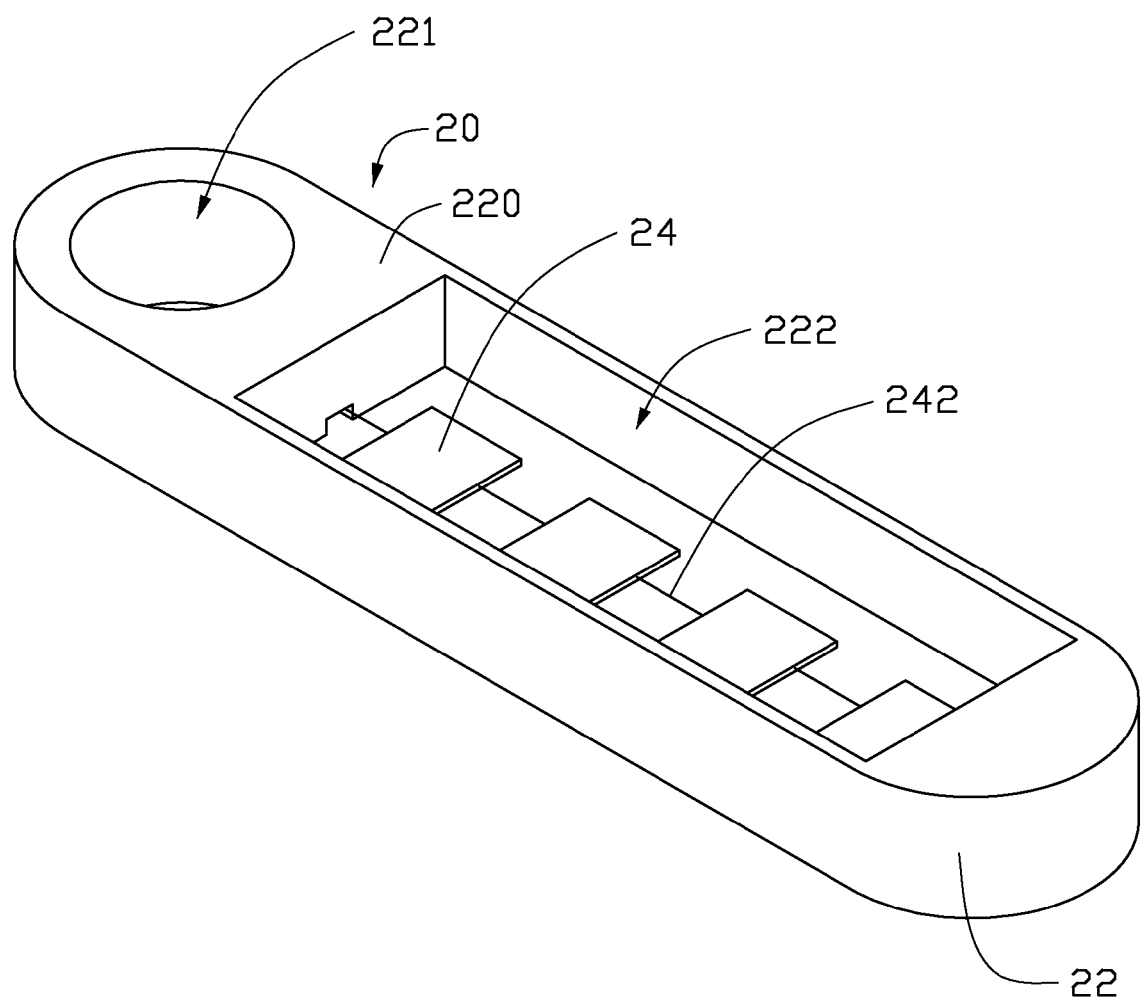
FIG. 2 is an isometric view illustrating one of the solar cell units in FIG. 1.

Referring to FIG. 2, each of the solar cell units 20 includes a housing 22 and a number of solar panels 24. The housing 22 defines a through hole 221 at one end and an opening 222 in an upper surface 220 thereof. The solar panels 24 are received in the housing 22 and facing the opening 222. The solar panels 24 may be electrically connected in series or parallel to each other. In the present embodiment, the solar panels 24 are electrically connected in series with electrical wires.

Figure 3:
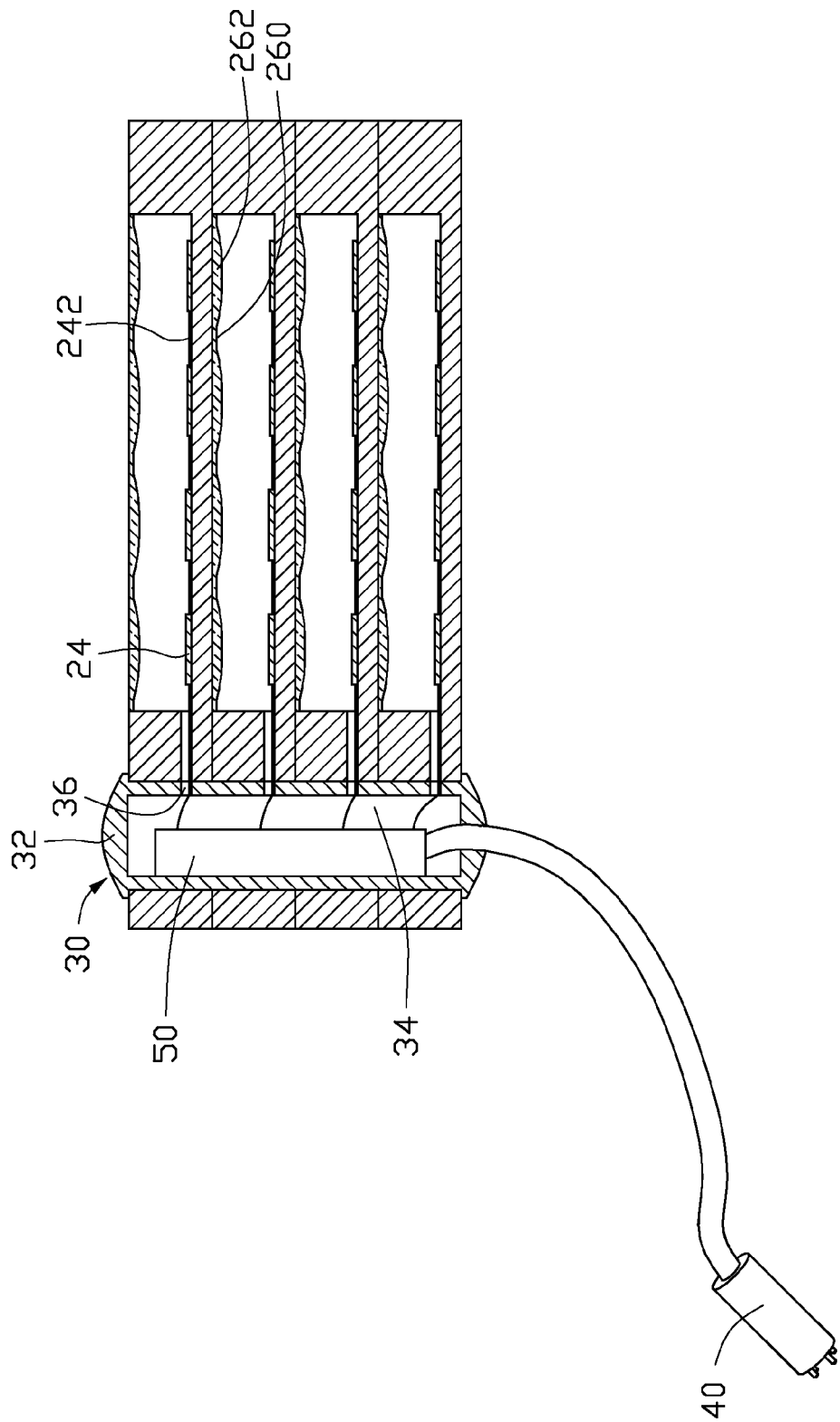
FIG. 3 is a cross-sectional view of of the portable solar power generator of FIG. 1 taken along line III-III.

The shaft 30 passes through the through holes 221 in the solar cell units 20 thereby aligning the solar cell units 20 in a manner that one stacked on another, and each of the solar cell units 20 is capable of rotating around the shaft 30. As shown in FIG. 3, to prevent the shaft 30 slide off from the solar cell units 20, a cap 32 is formed on each end of the shaft 30. The diameter of the cap 32 is larger than the inner diameter of the through hole 221.

Figure 4:
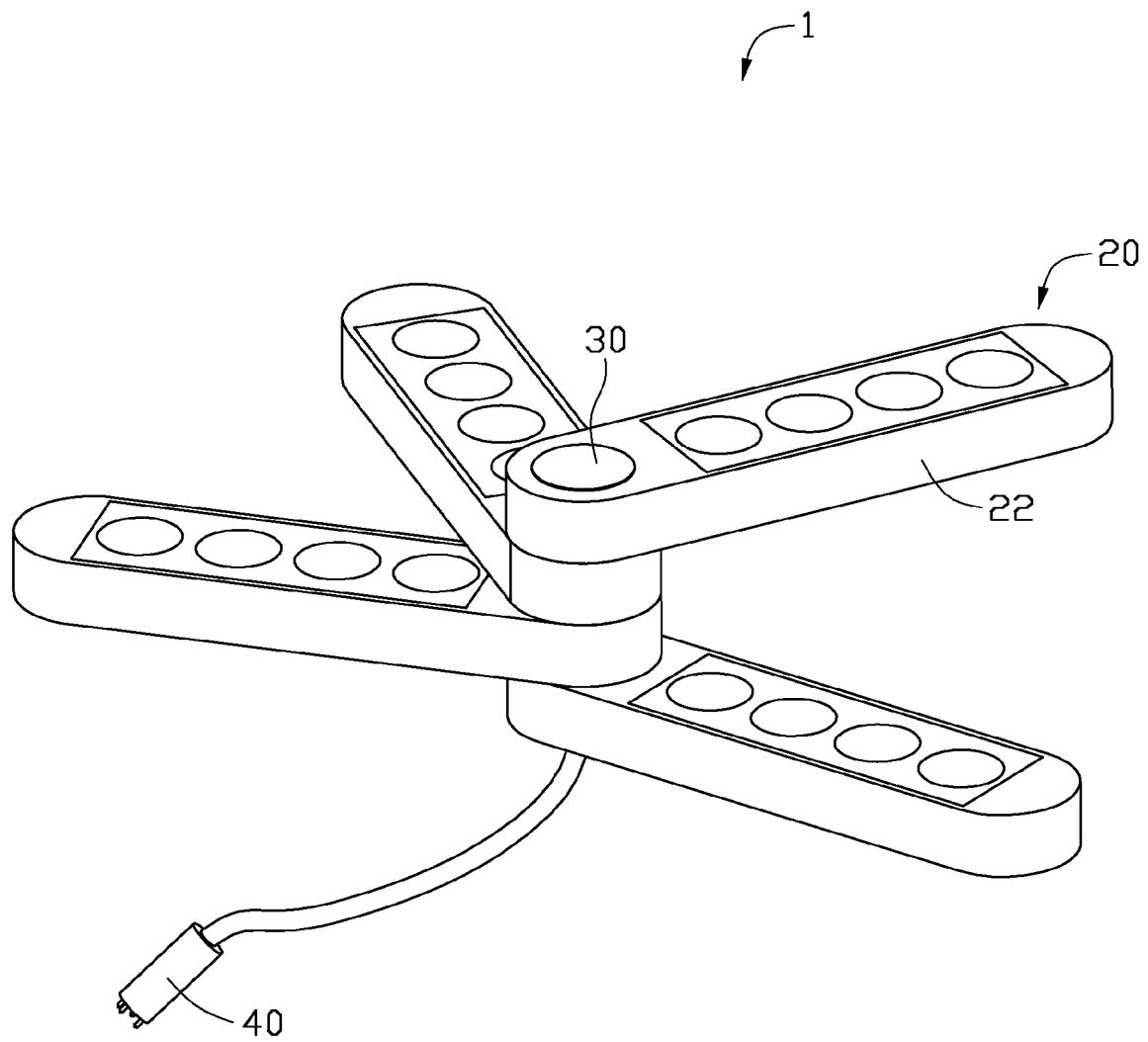
FIG. 4 is a schematic view showing the solar cells units in FIG. 1 are expanded.

The solar panels 24 are electrically coupled to the connector assembly 40. Referring to FIG. 4, the solar cell units 20 are expanded such that each of the solar cell units 20 is exposed to receive sun light. It is understood that a cross-section of the housing 22 in a direction perpendicular to the shaft 30 can be in a sector shape to fully utilize the sunlight. The solar cell units 20 transfer received sunlight into electrical energy. If a power consuming device (i.e., an energy storing means) is connected to the connector assembly 40, the solar power generator 1 can supply electrical energy to the power consuming device.

In the present embodiment, an energy storing means (i.e., a rechargeable battery, or a super-capacitor) 50 electrically connected to the solar panels 24 is employed to store electrical energy generated by the solar panels 24 when there is no power consuming device connected to connector assembly 40. The energy storing means 50 stores the electrical energy provided by the solar power generator 1 and can supply energy when there is insufficient sunlight. The shaft 30 is hollow and defines an inner receiving space 34. The energy storing means 50 is received in the receiving space 34. A number of holes 36 are defined in a sidewall of the shaft 30 for allowing electrical wires 242 to pass therethrough to electrically connect the energy storing means 50 with the solar panels 24.

To protect the solar panels 24 in the opening 222, a transparent cover 26 is arranged in the opening 222. The transparent cover 26 includes a base member 260 and a number of convex lens portions 262 fixed to the base member 260. Each of the convex lens portions 262 is disposed above a corresponding solar panel 24. Thus, the convex lens portions 262 converges light beams irradiated thereon to the solar panels 24. As such, the area of the solar panels 24 can be decreased to reduce cost. In other words, a sum of light sensitive area of the solar panel 24 is less than the area of the transparent cover. The convex lens portions 262 can be integrally formed with the base member 260.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A solar power generator, comprising:
   a plurality of solar cell units, each of the solar cell units comprising a housing defining a through hole at one end and an opening in an upper surface thereof, and a solar panel received in the housing and facing the opening,
   a shaft passing through the through holes of the solar cell units, the solar cell units being stackable one on another and rotatable relative to the shaft, the shaft defining an inner receiving space;
   an energy storing means electrically coupled to the solar panel for storing electrical energy generated in the solar panel, the energy storing means being received in the inner receiving space; and
   a connector assembly electrically coupled to the solar panels for providing electrical energy to a power consuming device.

2. The solar power generator as claimed in claim 1, wherein a cap is formed on each of two opposite ends of the shaft, the diameter of the cap being greater than the inner diameter of the through hole.

3. The solar power generator as claimed in claim 1, wherein a transparent cover is arranged in the opening of each solar cell unit.

4. The solar power generator as claimed in claim 1, wherein the transparent cover includes a base member and at least one convex lens portion fixed on the base member, each of the at least on convex lens portion is disposed above a corresponding solar panel for converging light irradiated thereon.

5. The solar power generator as claimed in claim 4, wherein the base member and the convex lens portion are integrally formed into a unitary piece.

6. The solar power generator as claimed in claim 1, wherein a sum of light sensitive area of the solar panel is less than the area of the transparent cover.

7. The solar power generator as claimed in claim 1, wherein a cross-section of the housing in a direction perpendicular to the shaft is in a sector shape.

\* \* \* \* \*